US008716967B2

(12) United States Patent
Okumura

(10) Patent No.: US 8,716,967 B2
(45) Date of Patent: May 6, 2014

(54) MOTOR CONTROL DEVICE

(75) Inventor: Shigekazu Okumura, Sakurai (JP)

(73) Assignee: JTEKT Corporation, Osaka-Shi (JP)

( * ) Notice: Subject to any disclaimer, the term of this patent is extended or adjusted under 35 U.S.C. 154(b) by 186 days.

(21) Appl. No.: 13/070,763

(22) Filed: Mar. 24, 2011

(65) Prior Publication Data

US 2011/0234130 A1   Sep. 29, 2011

(30) Foreign Application Priority Data

Mar. 29, 2010 (JP) ................................. 2010-075738

(51) Int. Cl.
*H02P 6/16* (2006.01)

(52) U.S. Cl.
USPC ...... 318/400.07; 318/490; 318/434; 318/724; 361/31; 361/33

(58) Field of Classification Search
USPC .................. 318/139, 400.07, 400.01, 400.12, 318/400.15, 700, 721, 254, 661, 715, 685, 318/138, 490, 400.42, 400.22, 400.16, 318/400.02, 434, 515, 400.13, 432, 299, 318/724, 803, 433; 701/62, 31.4, 41, 67, 701/36, 42; 361/31, 33
See application file for complete search history.

(56) References Cited

U.S. PATENT DOCUMENTS

| | | | |
|---|---|---|---|
| 6,498,451 B1 * | 12/2002 | Boules et al. | 318/661 |
| 6,683,435 B1 * | 1/2004 | Liang et al. | 318/727 |
| 6,906,492 B2 * | 6/2005 | Matsushita | 318/727 |
| 7,791,293 B2 * | 9/2010 | Nagase et al. | 318/400.01 |
| 2005/0093505 A1 * | 5/2005 | Kameya | 318/805 |
| 2006/0001392 A1 * | 1/2006 | Ajima et al. | 318/432 |
| 2007/0035272 A1 * | 2/2007 | Hattori et al. | 318/823 |
| 2009/0251831 A1 | 10/2009 | Shiba et al. | |
| 2010/0060222 A1 * | 3/2010 | Kezobo et al. | 318/490 |

FOREIGN PATENT DOCUMENTS

| | | |
|---|---|---|
| DE | 10 2008 034 326 A1 | 2/2009 |
| JP | A-2008-11683 | 1/2008 |
| JP | A 2008-099394 | 4/2008 |
| JP | A 2009-035155 | 2/2009 |
| JP | A-2009-142053 | 6/2009 |

OTHER PUBLICATIONS

Notification of Reasons for Refusal issued in Japanese Patent Application No. 2010-075738 dated Feb. 27, 2014 (w/ partial translation).

* cited by examiner

*Primary Examiner* — Eduardo Colon Santana
*Assistant Examiner* — Jorge L Carrasquillo
(74) *Attorney, Agent, or Firm* — Oliff PLC

(57) ABSTRACT

A motor control device for controlling a three-phase brushless motor that has a rotor and field coils includes: a load range determining unit that determines a rotor rotation angle range, in which the three-phase brushless motor becomes a load, as a load range when a short-circuit fault occurs in one of a plurality of switching elements. The load range determining unit determines a rotor rotation angle range, in which load current is presumed to flow through a closed circuit formed of the short-circuit switching element and any one of regenerative diodes connected in parallel with the respective normal switching elements when the rotor is rotated in a state where all the switching elements other than the short-circuit switching element are turned off, as the load range.

7 Claims, 9 Drawing Sheets

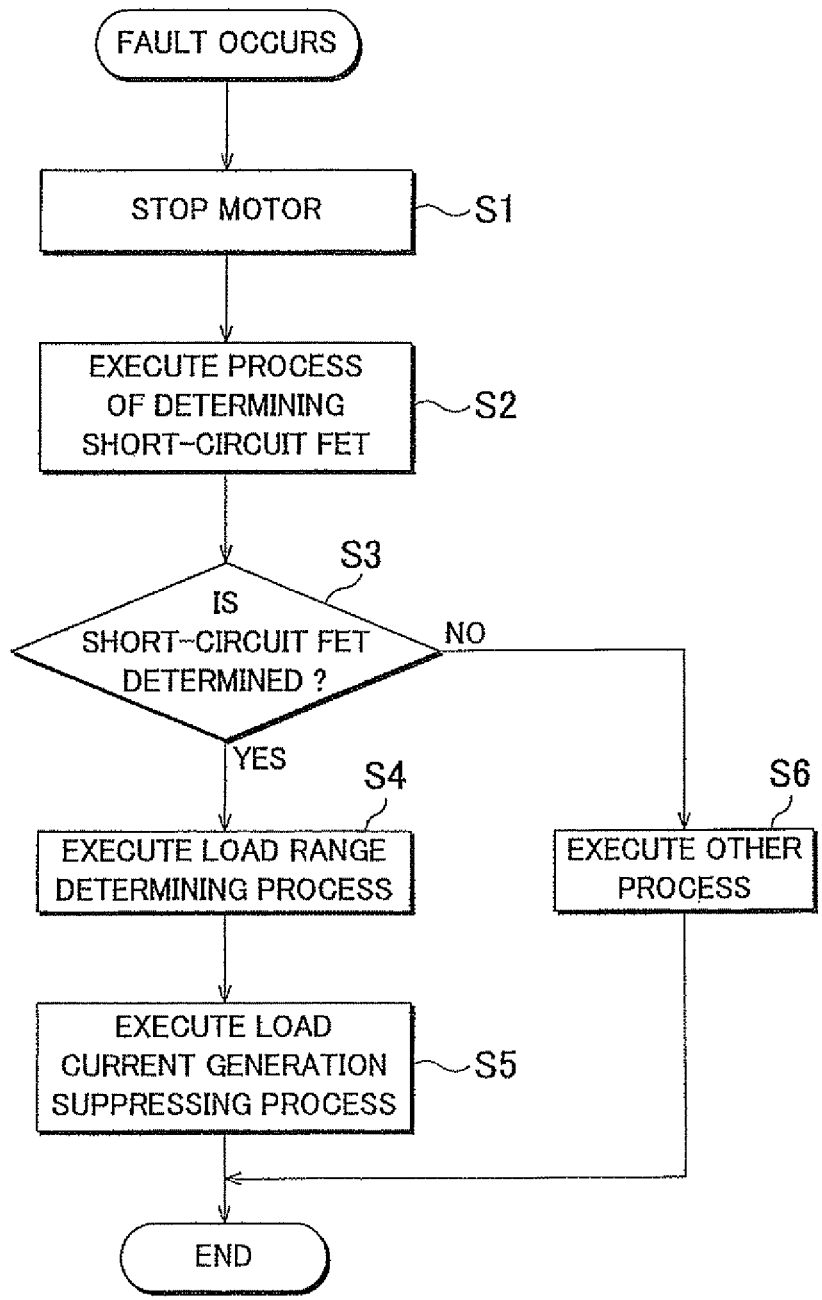

MOTOR CONTROL DEVICE

INCORPORATION BY REFERENCE

The disclosure of Japanese Patent Application No. 2010-075738 filed on Mar. 29, 2010 including the specification, drawings and abstract is incorporated herein by reference in its entirety.

BACKGROUND OF THE INVENTION

1. Field of the Invention

The invention relates to a motor control device for driving a three-phase brushless motor. The three-phase brushless motor is, for example, used as a source for generating steering assist force in an electric power steering.

2. Description of Related Art

A driving circuit of a brushless motor used in an electric power steering is formed to include switching elements, such as field effect transistors (FETs). When a fault occurs in any one of the switching elements, there is a possibility that the brushless motor becomes a load when a steering wheel is operated and, as a result, steering operation becomes heavy. In order to take measures against such a problem, a relay is inserted in a connection between the brushless motor and the driving circuit. Far example, in the case of a three-phase brushless motor, relays are respectively inserted in the motor connections of two phases, and then those relays are turned off during non-control or when a fault occurs in any one of the switching elements.

SUMMARY OF TIM INVENTION

The invention provides a motor control device that is able to determine a load range in which a three-phase brushless motor becomes a load when a short-circuit fault occurs in one of switching elements in a driving circuit of the three-phase brushless motor.

An aspect of the invention relates to a motor control device for controlling a three-phase brushless motor that has a rotor and field coils. The motor control device includes: a driving circuit that includes three series circuits, each having two switching elements connected in series with each other, in correspondence with respective phases of the three-phase brushless motor, wherein those series circuits are connected in parallel with one another between a power supply and a ground, and regenerative diodes are respectively connected in parallel with the corresponding switching elements; and a load range determining unit that determines a rotor rotation angle range, in which the three-phase brushless motor becomes a load, as a load range when a short-circuit fault occurs in one of the plurality of switching elements. The load range determining unit determines a rotor rotation angle range, in which load current is presumed to flow through a closed circuit formed of the short-circuit switching element and any one of the regenerative diodes connected in parallel with the respective normal switching elements when the rotor of the three-phase brushless motor is rotated in a state where all the switching elements other than the short-circuit switching element are turned off, as the load range.

When a short-circuit fault occurs in one of the plurality of switching elements, load current flows through a closed circuit that is formed of the short-circuit switching element and any one of the regenerative diodes connected in parallel with the respective normal switching elements when the rotor of the three-phase brushless motor is rotated to fall within a certain rotation angle range in a state where all the switching elements other than the short-circuit switching element are turned off. The rotor rotation angle range, in which such load current is presumed to flow, is determined as the load range in which the three-phase brushless motor becomes a load. In this way, the above aspect is able to determine a load range in which the three-phase brushless motor becomes a load when a short-circuit fault occurs in one of the switching elements in the driving circuit of the three-phase brushless motor.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 5 is a flowchart that shows the operation of a control unit when a short-circuit fault occurs;

DETAILED DESCRIPTION OF EMBODIMENTS

Figure 1:
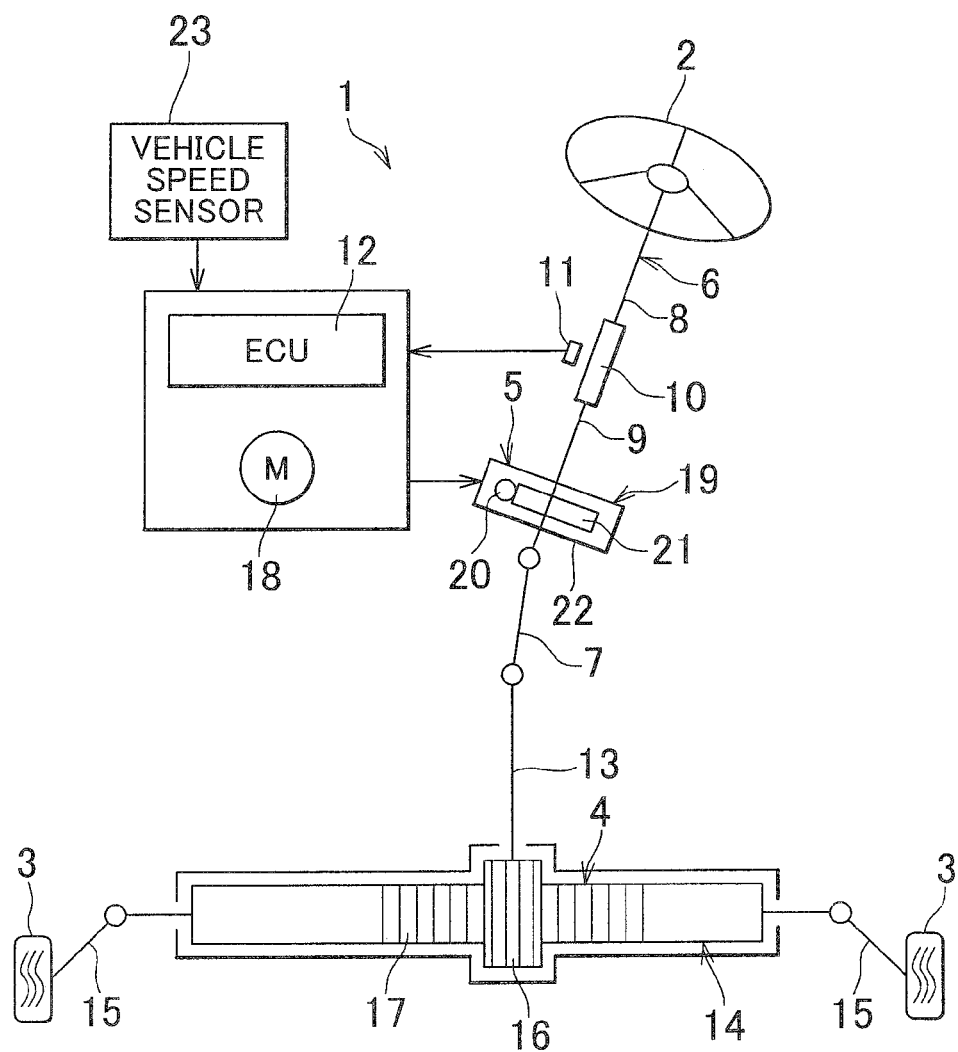
FIG. 1 is a diagram that shows the schematic configuration of an electric power steering to which a motor control device according to an embodiment of the invention is applied.

Hereinafter, an embodiment of the invention will be, described in detail with reference to the accompanying drawings. FIG. 1 is a diagram that shows the schematic configuration of an electric power steering to which a motor control device according to the embodiment of the invention is applied. The electric power steering 1 includes a steering wheel 2, a steering mechanism 4 and a steering assist mechanism 5. The steering wheel 2 serves as a steering member. The steering mechanism 4 steers steered wheels 3 in synchronization with the rotation of the steering wheel 2. The steering assist mechanism 5 is used to assist a driver in steering operation. The steering wheel 2 is mechanically coupled to the steering mechanism 4 via a steering shaft 6 and an intermediate shaft 7.

The steering shaft 6 extends linearly. In addition, the steering shaft 6 includes an input shaft 8 and an output shaft 9. The input shaft 8 is coupled to the steering wheel 2. The output shaft 9 is coupled to the intermediate shaft 7. The input shaft 8 is relatively rotatably coupled to the output shaft 9 via a torsion bar 10 along the same axis. That is, when the steering wheel 2, is rotated, the input shaft 8 and the output shaft 9 rotate in the same direction while rotating relative to each other.

A torque sensor 11 is arranged around the steering shaft 6. The torque sensor 11 detects a steering torque applied to the steering wheel 2 on the basis of the amount of relative rotational displacement between the input shaft 8 and the output shaft 9. The steering torque detected by the torque sensor 11 is input to an electronic control unit (ECU) 12. In addition, a vehicle speed detected by a vehicle speed sensor 23 is input to the ECU 12.

The steering mechanism 4 is formed of a rack-and-pinion mechanism. The rack-and-pinion mechanism includes a pinion shaft 13 and a rack shaft 14. The rack shaft 14 serves as a steered shaft. Each steered wheel 3 is coupled to a corresponding one of the end portions of the rack shaft 14 via a tie rod 15 and a knuckle arm (not shown). The pinion shaft 13 is coupled to the intermediate shaft 7. The pinion shaft 13 rotates in synchronization with the steering operation of the steering wheel 2. A pinion 16 is coupled to the distal end (lower end in FIG. 1) of the pinion shaft 13.

The rack shaft 14 extends linearly in a transverse direction, of an automobile. A rack 17 is formed in the middle of the rack shaft 14 in the axial direction. The rack 17 is in mesh with the pinion 16. The pinion 16 and the rack 17 convert the rotation of the pinion shaft 13 to the movement of the rack shaft 14 in the axial direction. By moving the rack shaft 14 in the axial direction, the steered wheels 3 may be steered.

When the steering wheel 2 is steered (rotated), the rotation is transmitted to the pinion shaft 13 via the steering shaft 6 and the intermediate shaft 7. Then, the rotation of the pinion shaft 13 is converted to the movement of the rack shaft 13 in the axial direction by the pinion 16 and the rack 17. Through the movement of the rack shaft 13 in the axial direction, the steered wheels 3 are steered. The steering assist mechanism 5 includes an electric motor 18 and a reduction mechanism 19. The electric motor 18 is used to assist in steering operation. The reduction mechanism 19 is used to transmit the output torque of the electric motor 18 to the steering mechanism 4. In this embodiment, the electric motor 3 is formed of a three-phase brushless motor. The reduction mechanism 19 is formed of a worm gear mechanism. The worm gear mechanism includes a worm shaft 20 and a worm wheel 21. The worm wheel 21 is in mesh with the worm shaft 20. The reduction mechanism 19 is accommodated in a gear housing 22. The gear housing 22 serves as a transmission mechanism housing.

The worm shaft 20 is driven by the electric motor 18 for rotation. In addition, the worm wheel 21 is coupled to the steering shaft 6 so as to be rotatable in the same direction as the steering shaft 6 rotates. The worm wheel 21 is driven by the worm shaft 20 for rotation. When the worm shaft 20 is driven by the electric motor 18 for rotation, the worm wheel 21 is driven for rotation, and then the steering shaft 6 rotates. Then, the rotation of the steering shaft 6 is transmitted to the pinion shaft 13 via the intermediate shaft 7. The rotation of the pinion shaft 13 is converted to the movement of the rack shaft 14 in the axial direction. Through the movement of the rack shaft 14 in the axial direction, the steered wheels 3 are steered. That is, when the worm shaft 2 is driven by the electric motor 18 for rotation, the steered wheels 3 are steered.

The electric motor 18 is controlled by the ECU 12 that serves as a motor control device. The ECU 12 controls the electric motor 18 on the basis of the steering torque detected by the torque sensor 11, the vehicle speed detected by the vehicle speed sensor 23, and the like. Specifically, the ECU 12 determines a target assist amount using a map that stores the correlation between a steering torque and a target assist amount for each vehicle speed and then executes control such that assist force generated by the electric motor 18 approaches the target assist amount.

Figure 2:
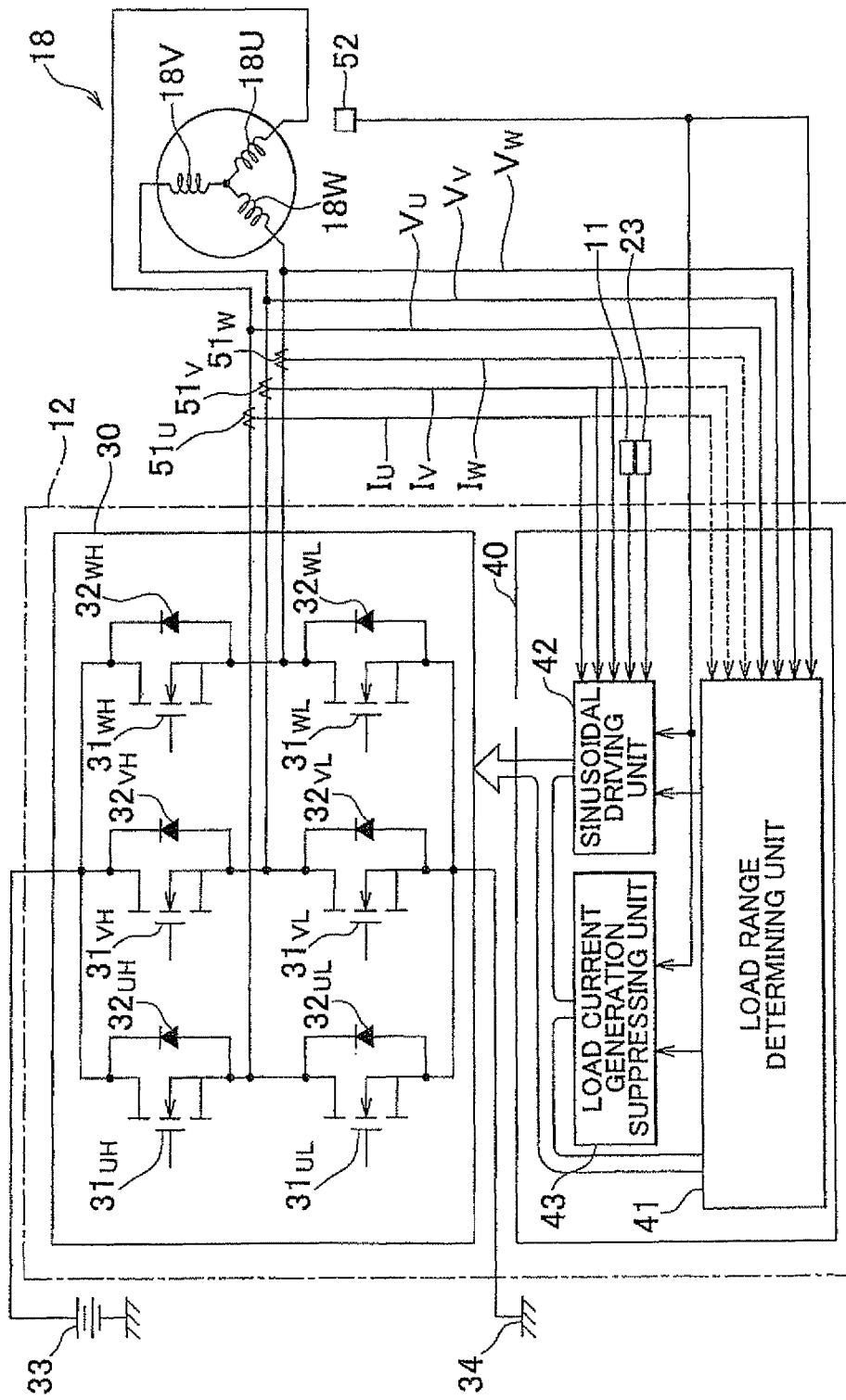
FIG. 2 is a block diagram that shows the electrical configuration of an ECU that serves as the motor control device.

FIG. 2 is a schematic diagram that shows the electrical configuration of the ECU 12 that serves as the motor control device. The electric motor 18 includes a stator and a rotor. The stator has a U-phase field coil 18U, a V-phase field coil 18V and a W-phase field coil 18W. A permanent magnet is fixed to the rotor. The permanent magnet receives repulsive magnetic fields from these field coils 18U, 18V and 18W. The ECU 12 includes a driving circuit 30 and a control unit 40. The driving circuit 30 generates electric power for driving the electric motor 18. The control unit 40 is used to control the driving circuit 30. The control unit 40 is formed of a microcomputer that includes a CPU and a memory (ROM, RAM, nonvolatile memory, or the like) that, for example, stores operation programs for operating the CPU.

The driving circuit 30 is a three-phase bridge inverter circuit. In the driving circuit 30, a series circuit of a pair of field effect transistors (FETs) 31UH and 31UL corresponding to the U phase of the electric motor 18, a series circuit of a pair of FETs 31VH and 31VL corresponding to the V phase of the electric motor 18 and a series circuit of a pair of FETs 31WH and 31WL corresponding to the W phase of the electric motor 18 are connected in parallel with one another between a direct-current power supply 33 and a ground 34. In addition, regenerative diodes 32UH to 32WL are respectively connected in parallel with the FETs 31UH to 31WL in an orientation such that forward current flows from the side adjacent to the ground 34 to the side adjacent to the direct-current power supply 33.

In the following description, the power supply-side FET of the pair of FETs of each phase is termed a "high-side FET" and the ground-side FET is termed a "low-side FET" where appropriate. In addition, the six FETs 31UH to 31WL are collectively termed FETs 31. Similarly, the six regenerative diodes 32UH to 32WL are collectively termed "regenerative diodes 32".

The U-phase field coil 18U of the electric motor 18 is connected to a connecting point of the pair of FETs 31 UH and 31UL corresponding to the U phase. The V-phase field coil 18V of the electric motor 18 is connected to a connecting point of the pair of FETs 31VH and 31VL corresponding to the V phase. The W-phase field coil 18W of the electric motor 18 is connected to a connecting point of the pair of FETs 31WH and 31WL corresponding to the W phase. Current sensors 51U, 51V and 51W are respectively provided in connection lines that connect the field coils 18U, 18V and 18W of the respective phases to the driving circuit 30. The current sensors 51U, 51V and 51W are used to detect phase currents IU, IV and IW of the respective phases. A rotation angle sensor 52, such as a resolver, is provided at the side of the electric motor 18. The rotation angle sensor 52 is used to detect the rotation angle (electrical angle) of the rotor.

The control unit 40 executes predetermined operation programs stored in the memory to function as a plurality of functional processing units. The plurality of functional processing units include a load range determining unit 41, a sinusoidal driving unit 42 and a load current generation suppressing unit 43. The sinusoidal driving unit 42 controls the FETs 31 during normal times when no fault is occurring to thereby sinusoidally drive the electric motor 18. The rotation angle (electrical angle) of the rotor, detected by the rotation angle sensor 54, the steering torque detected by the torque sensor 11, the vehicle speed detected by the vehicle speed sensor 23 and the phase currents IU, IV and IW of the respective phases, detected by the current sensors 51U, 51V and 51W, are input to the sinusoidal driving unit 42. The sinusoidal driving unit 42, for example, determines a target assist amount on the basis Of the map that stores the correlation between a steering torque and a target assist amount (target current value) for each vehicle speed, the steering torque detected by the torque sensor 11 and the vehicle speed detected by the vehicle speed sensor 23. Then, the sinusoidal driving unit 42 executes pulse width modulation (PWM) control over the FETs 31 so that the assist force (torque) generated by the electric motor 18 approaches the target assist amount on the basis of the target assist amount, the phase currents IU, IV and IW of the respective phases, detected by the current sensors 51U, 51V and 51W, and the rotor rotation angle detected by the rotation angle sensor 52.

The load range determining unit 41 executes control for stopping the electric motor 18 when an abnormality of the electric motor 18 is detected, determines whether a short-circuit fault is occurring in any one of the FETs 31, determines the short-circuit FET 31 when a short-circuit fault is occurring in any one of the FETs 31, and determines a load range. The load range is a rotor rotation angle range in which the electric motor 18 becomes a load. In this embodiment, when a short-circuit fault occurs in one of the six FETs 31UH to 31WL, the rotor rotation angle range, in which load current is presumed to flow through a closed circuit that is formed of the short-circuit FET and any one of the regenerative diodes connected in parallel with the respective normal FETs other than the short-circuit FET when the rotor is rotated in a state where all the FETs other than the short-circuit FET are turned off, is determined as the load range.

Figure 3:
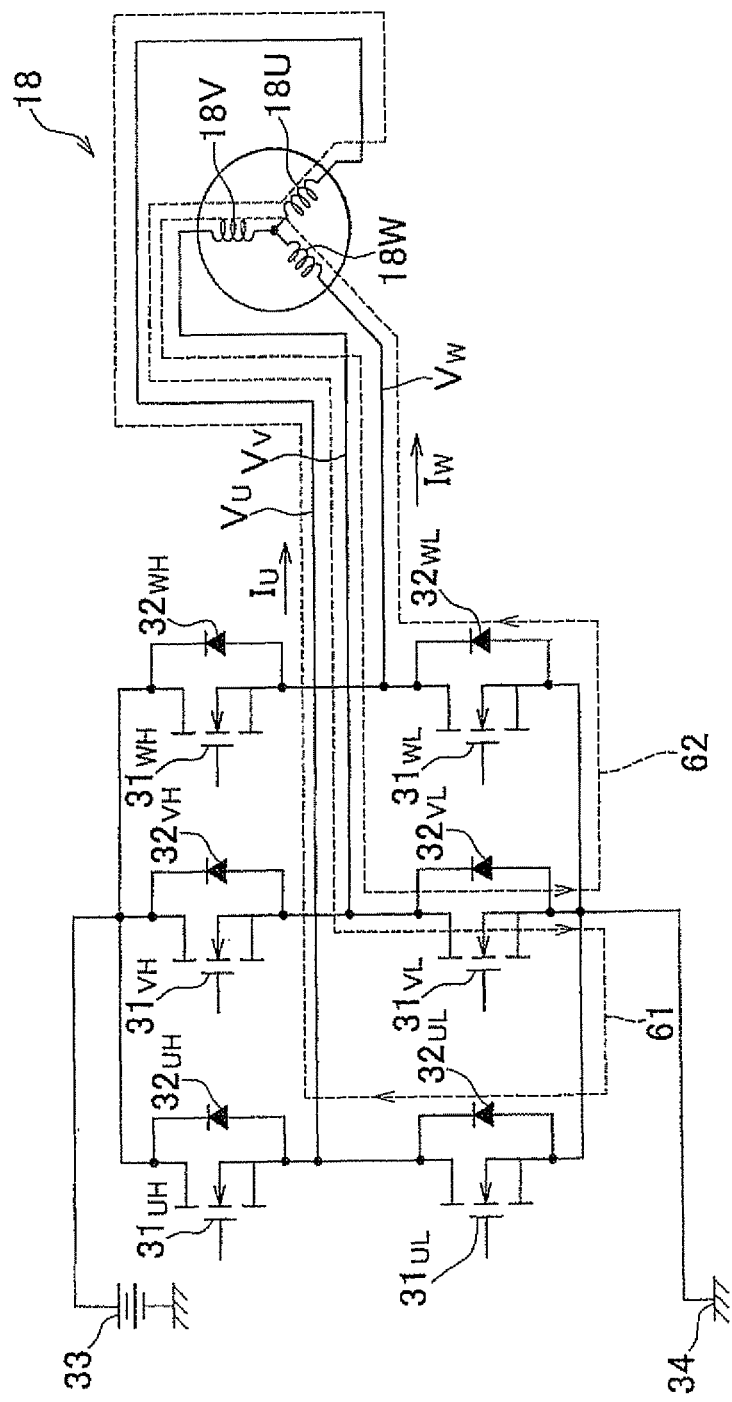
FIG. 3 is an electrical circuit diagram that shows closed circuits through which load current flows when a short-circuit fault occurs in a low-side FET.

As shown in FIG. 3, for example, it is assumed that, when a short-circuit fault occurs in the V-phase low-side FET 31VL, the rotor is rotated through driver's steering operation in a state where all the other FETs are turned off. In this case, induced voltage is generated in the electric motor 18, and causes load current to flow in the direction indicated by the arrows in a first closed circuit 61 and in the direction indicated by the arrows in a second closed circuit 62.

The first closed circuit 61 includes the short-circuit V-phase low-side FET 31VL, the regenerative diode 32UL that is connected in parallel with the normal U-phase low-side FET 31UL, the U-phase field coil 18U and the V-phase field coil 18V. On the other hand, the second closed circuit 62 includes the short-circuit V-phase low-side FET 31VL, the regenerative diode 32WL connected in parallel with the normal W-phase low-side FET 31WL, the W-phase field coil 18W and the V-phase field coil 18V.

Thus, when a short-circuit fault occurs in the V-phase low-side FET 31VL, the rotor rotation angle range, in which load current flows through the first closed circuit 61 or the second closed circuit 62, is determined as the load range. Particularly, the rotor rotation angle range, in which load current flows through the first closed circuit 61 that includes the U-phase field coil 18U, is termed a U-phase load range, and the rotor rotation angle range, in which load current flows through the second closed circuit 62 that includes the W-phase field coil 18W, is termed a W-phase load range.

Figure 4:
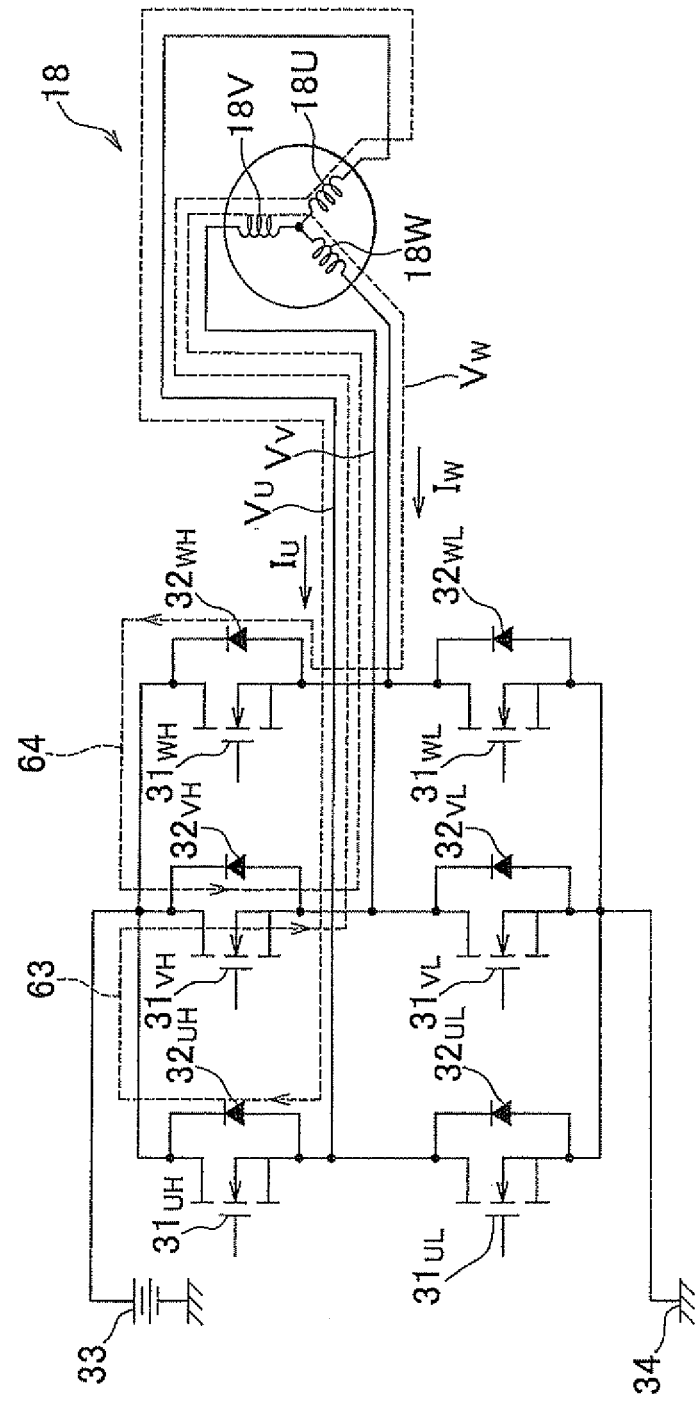
FIG. 4 is an electrical circuit diagram that shows closed circuits through which load current flows when a short-circuit fault occurs in a high-side FET.

On the other hand, as shown in FIG. 4, it is assumed that, when a short-circuit fault occurs in the V-phase high-side FET 31VH, the rotor is rotated through driver's steering operation in a state where all the other FETs are turned off. In this case, induced voltage is generated in the electric motor 18, and causes load current to flow in the direction indicated by the arrows in a third closed circuit 63 and in the direction indicated by the arrows in a fourth closed circuit 64.

The third closed circuit 63 includes the short-circuit V-phase high-side VET 31VH, the V-phase field coil 18V, the U-phase field coil 18U, and the regenerative diode 32UH connected in parallel with the normal U-phase high-side FET 31UH. On the other hand, the fourth closed circuit 64 includes the short-circuit V-phase high-side FET 31VH, the V-phase field coil 18V, the W-phase field coil 18W, and the regenerative diode 32WH connected in parallel with the normal W-phase high-side FET 31WH.

Thus, when a short-circuit fault occurs in the V-phase high-side FET 31VH, the rotor rotation angle range, in which load current flows through the third closed circuit 63 or the fourth closed circuit 64, is determined as the load range. Particularly, the rotor rotation angle range, in which load current flows through the third closed circuit 63 that includes the U-phase field coil 18U, is termed a U-phase load range, and the rotor rotation angle range, in which load current flows through the fourth closed circuit 64 that includes the W-phase field coil 18W, is termed a W-phase load range. In the following description, the phase that includes the short-circuit FET 31 is termed a short-circuit phase, and the other phases are termed normal phases where appropriate.

As shown in FIG. 3, in order for load current to flow in the direction indicated by the arrows in the first closed circuit 61 that includes the U-phase field coil 18U when a short-circuit fault is occurring in the V-phase low-side FET 31VL, the phase voltage VV of the V phase that is the short-circuit phase needs to be higher (larger) than the phase voltage VU of the U phase that is the normal phase. In addition, in this case, if the polarity of current that flows from the driving circuit 30 toward the electric motor 18 is positive, the polarity of the phase current IU of the U phase that is the normal phase is positive. Similarly, in order for load current to flow in the direction indicated by the arrows in the second closed circuit 62 that includes the W-phase field coil 18W, the phase voltage VV of the V phase that is the short-circuit phase needs to be higher than the phase voltage VW of the W phase that is the normal phase. In addition, in this case, the polarity of the phase current IW of the W phase that is the normal phase is positive.

As shown in FIG. 4, in order for load current to flow in the direction indicated by the arrows in the third closed circuit 63 that includes the U-phase field coil 18U when a short-circuit fault is occurring in the V-phase high-side FET 31VH, the phase voltage VV of the V phase that is the short-circuit phase needs to be lower (smaller) than the phase voltage VU of the U phase that is the normal phase. In addition, in this case, the polarity of the phase current IU of the U phase that is the normal phase is negative. Similarly, in order for load current to flow in the direction indicated by the arrows in the fourth closed circuit 64 that includes the W-phase field coil 18W, the phase voltage VV of the V phase that is the short-circuit phase needs to be lower than the phase voltage VW of the W phase that is the normal phase. In addition, in this case, the polarity of the phase current IW of the W phase that is the normal phase is negative.

The load current generation suppressing unit 43 shown in FIG. 2 executes the process of suppressing generation of load current within the load range determined by the load range determining unit 41. FIG. 5 is a flowchart that shows the operation of the control unit 40 when a short-circuit fault occurs. When the load range determining unit 41 shown in FIG. 2 detects an operation failure (fault) in the electric motor 18 while the electric motor 18 is sinusoidally driven by the sinusoidal driving unit 42, the load range determining emit 41 issues a motor stop command to the sinusoidal driving unit 42 (step S1). When the sinusoidal driving unit 42 shown in FIG. 2 receives the motor stop command from the load range determining unit 41, the sinusoidal driving unit 42 stops sinusoidal drive to turn off all the FETs 31. Because all the FETs 31 are turned off, the electric motor 18 stops.

After that, the load range determining unit 41 executes the process of determining whether a short-circuit fault is occurring on the basis of the phase voltages VU, VV and VW and then determining the short-circuit FET when a short-circuit fault is occurring (step S2). Specifically, the load range determining unit 41 first executes primary determination process. In the primary determination process, the load range determining unit 41 acquires the phase voltages VU, VV and VW. Then, the load range determining unit 41 checks whether a first condition that any one of the phase voltages is lower than or equal to a predetermined ground level VG (for example, 0.5 [V]) is satisfied and whether a second condition that any one of the phase voltages is higher than or equal to a predetermined power supply level VB (for example, 5.0 [V]) is satisfied. When the first condition is satisfied, the load range determining unit 41 determines that a short-circuit fault is occurring in the low-side FET of any one of the phases. When the second condition is satisfied, the load range determining unit 41 determines that a short-circuit fault is occurring in the high-side FET of any one of the phases. When neither the first condition nor the second condition is satisfied, the load range determining unit 41 determines that no short-circuit fault is occurring.

When it is determined through the primary determination process that the short-circuit FET 31 is the high-side FET or the low-side FET, the load range determining unit 41 executes secondary determination process. In the secondary determination process, the load range determining unit 41 controls the FETs 31 in accordance with the rotor rotation angle to flow current to the electric motor 18 (forced commutation control). Then, the load range determining unit 41 monitors the phase voltages VU, VV and VW and then determines the phase (short-circuit phase) of the short-circuit FET 31 on the basis of the voltage waveforms of those phase voltages VU, VV and VW. By so doing, it is, possible to determine one short-circuit FET 31.

When the short-circuit FET is not able to be determined (including the case where it is determined that no short-circuit fault is occurring) (NO in step S3), a process (hereinafter, referred to as "other process") other than a load range determining process (described later) is executed (step S6). The "other process" includes that no process is executed. When the short-circuit FET is able to be determined (YES in step S3), the load range determining unit 41 executes the load range determining process (step S4). The details of the load range determining process will be described later. When the load range is determined, the load current generation suppressing unit 43 starts load current generation suppressing process (step S5). The details of this process will be described later.

The load range determining process in step S4 will be described. The following three types of methods may be used to determine a load range.
(a) A load range is determined on the basis of phase voltages (induced voltages) (hereinafter, referred to as "first method").
(b) A load range is determined on the basis of phase currents (load currents) (hereinafter, referred to as "second method").
(c) A load range is determined on the basis of the correlation between a short-circuit phase and the other two normal phases (hereinafter, referred to as "third method").

The first method and the second method determine a load range in a state where induced voltages are being generated. Therefore, it is necessary that the rotor is being rotated. Thus, when the electric motor 18 is being rotated through driver's steering operation, it is possible to determine a load range in that state; whereas, when the electric motor 18 is not being rotated through steering operation; the load range determining unit 41 needs to control the FETs 31 in accordance with the rotor rotation angle to thereby forcibly drive the electric motor 18 for rotation. In contrast to this, the third method determines a load range on the basis of theoretical values calculated in advance or data measured in advance, so it is not necessary that the rotor is being rotated.

First, the first method will be described. The description will be made separately in the case where the short-circuit FET is a low-side FET and in the case where the short-circuit FET is a high-side FET. First, the case where a short-circuit fault is occurring in the low-side FET will be described. Here, as shown in FIG. 3, the case where a short-circuit fault is occurring in the V-phase low-side FET 31 VI, will be described as an example. The load range determining unit 41 determines the rotor rotation angle range, in which the phase voltage of the short-circuit phase (V phase in this example) is larger than the phase voltage of any one of the normal phases (U phase and W phase), as the load range. The rotor rotation angle (electrical angle) may be acquired from the rotation angle sensor 52.

Figure 6A:
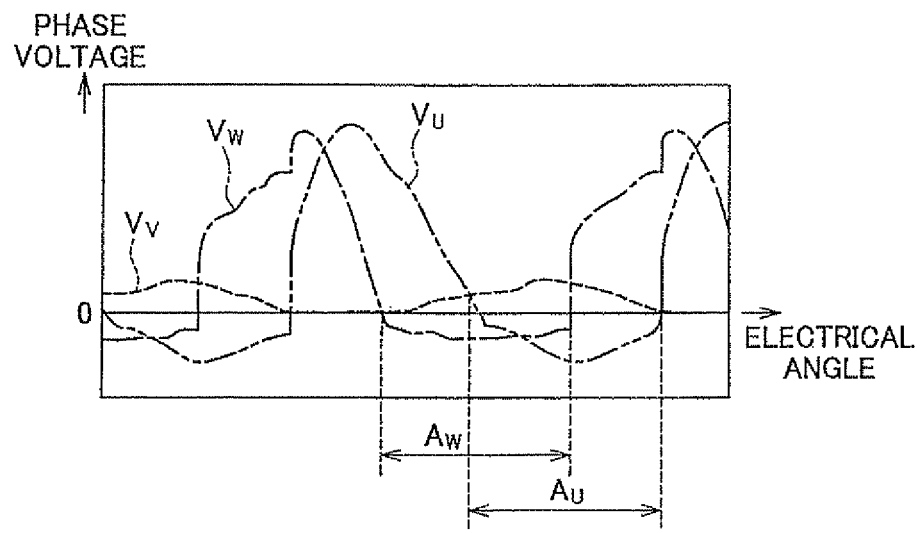
FIG. 6A is a graph for illustrating an example of operation of a load range determining unit.

FIG. 6A shows the phase voltages (induced voltages) VU, VV and VW of the respective phases when the rotor of the electric motor 18 is rotated through steering operation in the case where a short-circuit fault is occurring in the V-phase low-side FET 31VL. The electrical angle range, in which the phase voltage VV of the V phase that is the short-circuit phase is larger than the phase voltage VU of the U phase, is determined as the U-phase load range. In addition, the electrical angle range, in which the phase voltage VV of V phase that is the short-circuit phase is larger than the phase voltage VW of the W phase, is determined as the W-phase load range AW.

Figure 6B:
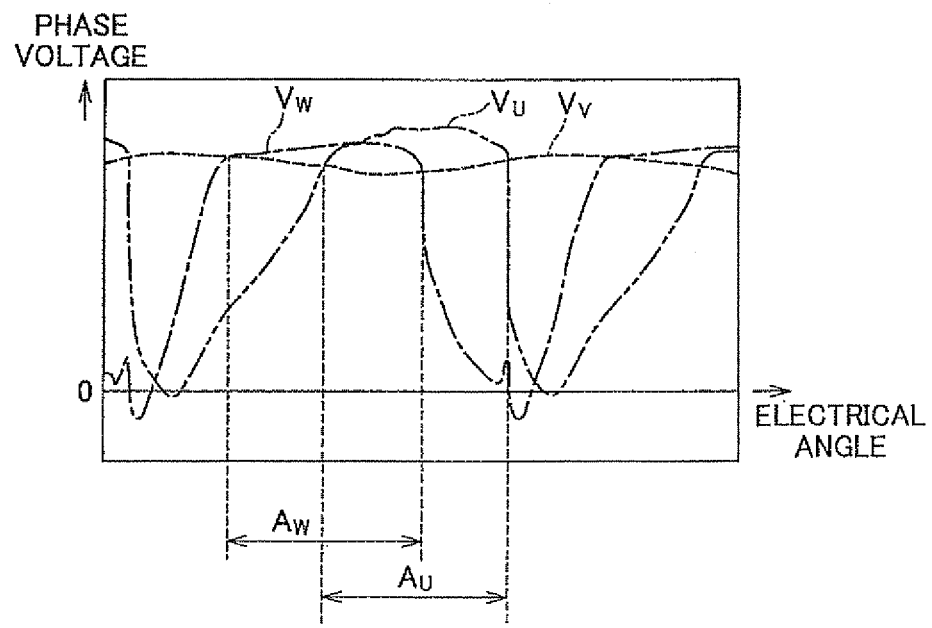
FIG. 6B is a graph for illustrating an example of operation of the load range determining unit.

The case where a short-circuit fault is occurring in the high-side FET will be described. Here, as shown in FIG. 4, the case where a short-circuit fault is occurring in the V-phase high-side FET 31VH will be described as an example. FIG. 6B shows the phase voltages (induced voltages) VU, VV and VW of the respective phases when the rotor of the electric motor 18 is rotated through steering operation in the case where a short-circuit fault is occurring in the V-phase high-side FET 31VH. The load range determining unit 41 determines the electrical angle range, in which the phase voltage of the short-circuit, phase (V phase in this example) is smaller than the phase voltage of any one of the normal phases (U phase and W phase), as the load range. More specifically, the electrical angle range, in which the phase voltage VV of the V phase that is the short-circuit phase is smaller than the phase voltage VU of the U phase, is determined as the U-phase load range. In addition, the electrical angle range, in which the phase voltage VV of the V phase that is the short-circuit phase is smaller than the phase voltage VW of the W phase, is determined as the W-phase load range AW.

Next, the second method will be described. When the second method is applied, as indicated by the broken lines in FIG. 2, the phase currents detected by the current sensors 51U, 51V and 51W are input to the load range determining unit 41. The description will be made separately in the case where the short-circuit FET is a low-side FET and in the case where the short-circuit FET is a high-side FET. First, the case where a short-circuit fault is occurring in the low-side FET will be described. Here, as shown in FIG. 3, the case where a short-circuit fault is occurring in the V-phase low-side FET 31VL will be described as an example. The load range determining unit 41 determines the electrical angle range, in which the polarity of any one of the phase currents IU and IW of the U phase and W phase that are the normal phases, is positive as the load range.

Figure 7A:
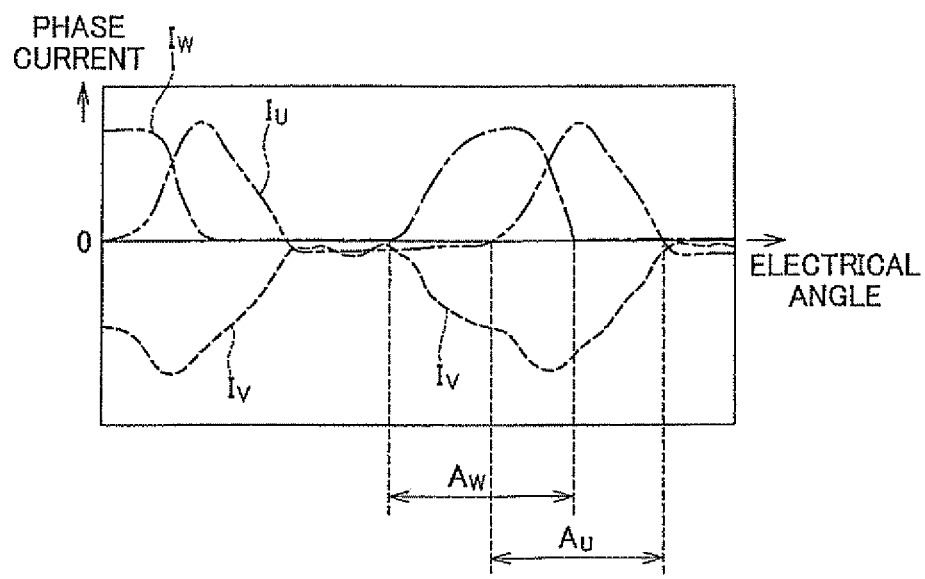
FIG. 7A is a graph for illustrating another example of operation of the load range determining unit.

FIG. 7A shows the phase currents IU, IV and IW when the rotor of the electric motor 18 is rotated through steering operation in the case where a short-circuit fault is occurring in the V-phase low-side FET 31VL. The electrical angle range, in which the polarity of the phase current IU of the U phase that is the normal phase is positive, is determined as the U-phase load range AU. In addition, the electrical angle range, in which the polarity of the phase current IW of the W phase that is the normal phase is positive, is determined as the W-phase load range AW.

Figure 7B:
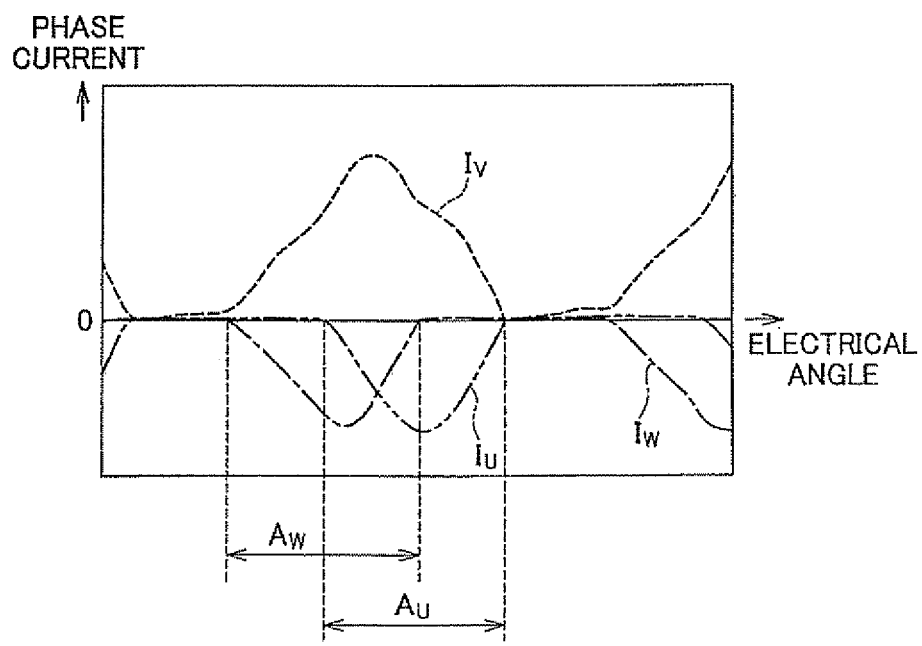
FIG. 7B is a graph for illustrating another example of operation of the load range determining unit.

The case where a short-circuit fault is occurring in the high-side FET will be described. Here, as shown in FIG. 4, the case where a short-circuit fault is occurring in the V-phase high-side FET 31VH will be described as an example. FIG. 7B shows the phase currents IU, IV and IW when the rotor of the electric motor 18 is rotated through steering operation in the case where a short-circuit fault is occurring in the V-phase high-side FET 31VH. The load range determining unit 41 determines the electrical angle range, in which the polarity of any one of the phase currents IU and IW of the U phase and W phase that are the normal phases is negative, as the load range. More specifically, the electrical angle range, in which the polarity of the phase current IU of the U phase that is the normal phase is negative, is determined as the U-phase load range AU. In addition, the electrical angle range, in which the polarity of the phase current IW of the W phase that is the normal phase is negative, is determined as the W-phase load range AW.

The third method will be described. In the third method, a map that stores the load range in the case where a short-circuit fault occurs in the FBI 31 is prepared for each FET 31 in advance and is stored in a nonvolatile memory. The maps are prepared on the basis of theoretical values or measured data. The load range determining unit 41 determines the load range on the basis of information that indicates the location of the short-circuit FET 31 and the maps.

Figure 8A:
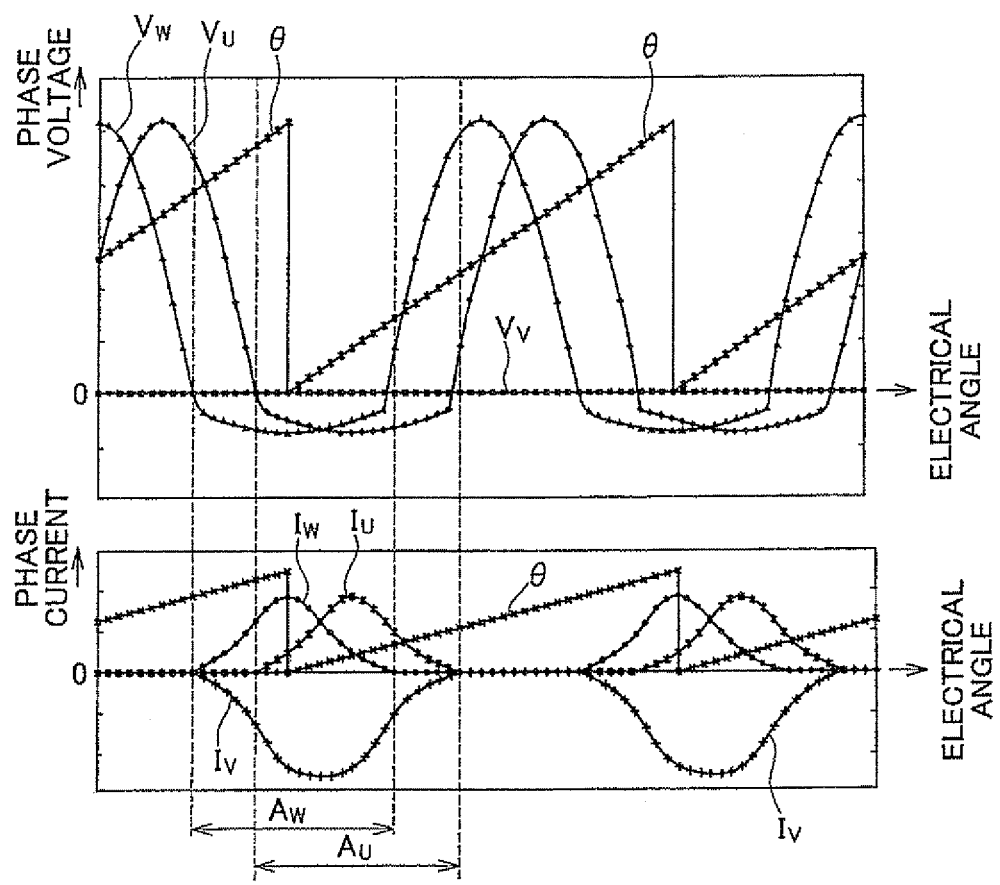
FIG. 8A is a graph for illustrating further another example of operation of the load range determining unit.

The case where the maps are prepared on the basis of theoretical values will be described. FIG. 8A shows theoretical values (simulation values) of the phase voltages (induced voltages) VU, VV and VW and phase currents IU, IV and IW of the respective phases, corresponding to an electrical angle θ, when it is assumed that a short-circuit fault is occurring in the V-phase low-side FET 31VL. In this example, during normal driving, the point at which the U-phase induced voltage waveform varies from positive to negative is set as 0° of the electrical angle θ. The load range in the case where a short-circuit fault occurs in the V-phase low-side FET 31VL is obtained in advance on the basis of the theoretical values shown in FIG. 8A. Specifically, the U-phase load range AU (330° to 150° in this example) and the W-phase load range AW (270° to 90° in this example) are obtained in advance.

Figure 8B:
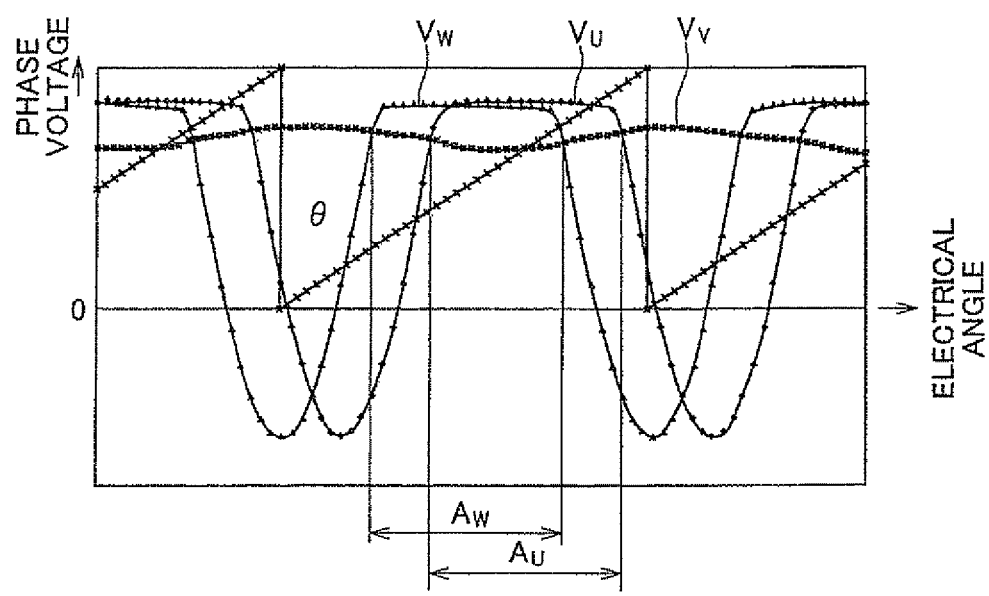
FIG. 8B is a graph for illustrating further another example of operation of the load range determining unit.

FIG. 8B shows theoretical values (simulation values) of the phase voltages (induced voltages) VU, VV and VW of the respective phases, corresponding to an electrical angle θ, when it is assumed that a short-circuit fault is occurring in the V-phase high-side FET 31VH. The load range in the case where a short-circuit fault occurs in the V-phase high-side FET 31VH is obtained in advance on the basis of the theoretical values shown in FIG. 8B. Specifically, the U-phase load range AU (150° to 330° in this example) and the W-phase load range AW (90° to 270° in this example) are obtained in advance.

Similarly, the load range in the case where a short-circuit fault occurs in the U-phase low-side FET 31UL, the load range in the case where a short-circuit fault occurs in the U-phase high-side FET 31UH, the load range in the case where a short-circuit fault occurs in the W-phase low-side FET 31WL and the load range in the case where a short-circuit fault occurs in the W-phase high-side FET 31WH are obtained in advance. The map that stores the load range in the case where a short-circuit fault occurs in the FET 31 is prepared for each FET 31 on the basis of the thus obtained load ranges.

Next, the load current generation suppressing process in step S5 of FIG. 5 will be described. In order for load current to flow through the first or second closed circuit 61 or 62 shown in FIG. 3, the regenerative diode 32UL or 32WL in the closed circuit needs to be turned on by induced voltage through the short-circuit FET 31VL. Similarly, in order for load current to flow through the third or fourth closed circuit 63 or 64 shown in FIG. 4, the regenerative diode 32UH or 32WH in the closed circuit needs to be turned on by induced voltage through the short-circuit FET 31VH. Thus, in order to suppress generation of load current, it is only necessary to turn off the regenerative diode in the closed circuit through which load current is presumed to flow when the rotor rotation angle detected by the rotation angle sensor 52 falls within the load range determined by the load range determining unit 41.

The description will be more specifically made separately in the case where a short-circuit fault occurs in a low-side FET and in the case where a short-circuit fault occurs in a high-side FET. First, the case where a short-circuit fault occurs in the low-side FET will be described. For example, as shown in FIG. 3, the case where a short-circuit fault occurs in the V-phase low-side FET 31VL will be described as an example. As described above, in the U-phase load range AU, load current is presumed to flow through the first closed circuit 61. Then, when the rotor rotation angle falls within the U-phase load range AU, the regenerative diode 32UL in the first closed circuit 61 is turned off through the following method. That is, the load current generation suppressing unit 43 drives the FET that is connected in series with the regenerative diode 32UL in the first closed circuit 61, that is, the U-phase high-side FET 31UH, in a pulse width modulation (PWM) manner at the carrier frequency higher than that during normal driving. For example, when the carrier frequency during normal times is about 20 kHz, the load current generation suppressing unit 43 drives the FET 31UH in a PWM manner at the carrier frequency of about 300 kHz.

When the FET 31UH is driven in a PWM manner at the carrier frequency of about 300 kHz, current flows from the power supply 33 to the side adjacent to the ground 34 via the U-phase high-side FET 31UH, the series circuit of the two field coils 18U and 18V and the short-circuit FET 31VL. The impedance Z of the series circuit of the two field coils 18U and 18V is expressed by $Z=R+i(2\pi fL)$ (where i is imaginary unit) where the resistance component of the series circuit is R, the inductance component of the series circuit is L and the frequency of current that flows through the series circuit is f. In this case, because the carrier frequency is higher than that during normal driving, the frequency f of current that flows through the series circuit is high. Because the frequency f of current that flows through the series circuit is high, the inductive reactance ($2\pi fL$) of the series circuit is large, so the impedance Z of the series circuit is extremely large. As a result of the extremely large impedance Z, the cathode potential VU of the regenerative diode 32UL in the first closed circuit 61 is higher than the anode potential VV, so the regenerative diode 32UL turns off. Because the regenerative diode 32UL turns off, it is possible to block or suppress flow of load current through the first closed circuit 61.

Similarly, when the rotor rotation angle falls within the W-phase load range AW, the load current generation suppressing unit 43 just needs to drive the FET that is connected in series with the regenerative diode 32WL in the second closed circuit 62, that is, the W-phase high-side FET 31WH, in a pulse width modulation (PWM) manner at the carrier frequency higher than that during normal driving. When the FET 31WH is driven in a PWM manner at the carrier frequency higher than that during normal driving, current flows from the power supply 33 to the side adjacent to the ground 34 via the W-phase high-side FET 31WH, the series circuit of the two field coils 18W and 18V and the short-circuit FET 31VL. Then, the impedance of the series circuit of the two field coils 18W and 18V is extremely large, so the cathode potential VW of the regenerative diode 32WL in the second closed circuit 62, is higher than the anode potential VV. Because the cathode potential VW is higher than the anode potential VV, the regenerative diode 32UL turns off. Because the regenerative diode 32UL turns off, it is possible to block or suppress flow of load current through the second closed circuit 62.

That is, when a short-circuit fault occurs in the low-side FET, the load current generation suppressing unit 43 drives the high-side FET of the normal phase in a PWM manner at the carrier frequency higher than that during normal driving when the rotor rotation angle detected by the rotation angle sensor 52 falls within the load range of that normal phase. Note that the load current generation suppressing unit 43 may drive the high-side FETs of both normal phases in a PWM manner at the carrier frequency higher than that during normal driving when the rotor rotation angle falls within the load range of any one of the normal phases without distinguishing the load ranges of the normal phases (U phase and W phase in the above example).

Next, the case where a short-circuit fault occurs in the high-side FET will be described. For example, as shown in FIG. 4, the case where a short-circuit fault occurs in the V-phase high-side. FET 31VH will be described as an example. As described above, in the U-phase load range AU, load current is presumed to flow through the third closed circuit 63. Then, when the rotor rotation angle falls within the U-phase load range, the regenerative diode 32UH in the third closed circuit 63 is turned off through the following method. That is, the load current generation suppressing unit 43 drives the FET that is connected in series with the regenerative diode 32UH in the third closed circuit 63, that is, the U-phase low-side FET 31UL, in a pulse width modulation (PWM) manner at the carrier frequency higher than that during normal driving. Then, current flows from the power supply 33 to the side adjacent to the ground 34 via the short-circuit FET 31VH, the series circuit of the two field coils 18V and 18U and the U-phase low-side FET 31UL. Then, the impedance Z of the series circuit of the two field coils 18V and 18U is extremely large, so the cathode potential VV of the regenerative diode 32UH in the third closed circuit 63 is higher than the anode potential VU. Because the cathode potential VV is higher than the anode potential VU, the regenerative diode 32UH turns off. Because the regenerative diode 32UH turns off, it is possible to block or suppress flow of load current through the third closed circuit 63.

Similarly, when the rotor rotation angle falls within the W-phase load range, the load current generation suppressing unit 43 just needs to drive the FET that is connected in series with the regenerative diode 32WH in the fourth closed circuit 64, that is, the W-phase low-side FET 31WL, in a PWM manner at the carrier frequency higher than that during normal driving. When the FET 31WL is driven in a PWM manner at the carrier frequency higher than that during normal driving, current flows from the power supply 33 to the side adjacent to the ground 34 via the short-circuit FET 31VH, the series circuit of the two field coils 18V and 18W and the W-phase low-side FET 31WL. Then, the impedance Z of the series circuit of the two field coils 18V and 18W is extremely large, so the cathode potential VV of the regenerative diode 32WH in the fourth closed circuit 64 is higher than the anode potential VW. Because the cathode potential VV is higher than the anode potential VW, the regenerative diode 32WH turns off. Because the regenerative diode 32WH turns off, it is possible to block or suppress flow of load current through the fourth closed circuit 64.

That is, when a short-circuit fault occurs in the high-side FET, the load current generation suppressing unit 43 drives the low-side FET of the normal phase in a PWM manner at the carrier frequency higher than that during normal driving when the rotor rotation angle detected by the rotation angle sensor 52 falls within the load range of that normal phase. Note that the load current generation suppressing unit 43 may drive the low-side FETs of both normal phases in a PWM manner at the carrier frequency higher than that during normal driving when the rotor rotation angle falls within the load range of any one of the normal phases without distinguishing the load ranges of the normal phases (U phase and W phase in the above example).

According to the above embodiment, when a short-circuit fault occurs in one of the six FETs in the driving circuit 30, the load range in which the electric motor 18 becomes a load may be determined. In addition, in such a case, it is possible to suppress generation of load current, so it is possible to suppress or prevent heavy steering operation. Note that the aspect of the invention may also be applied to a three-phase brushless motor that is used in a device other than the electric power steering.

While the invention has been described with reference to example embodiments thereof, it is to be understood that the invention is not limited to the described embodiments or constructions. To the contrary, the invention is intended to cover various modifications and equivalent arrangements. In addition, while the various elements of the example embodiments are shown in various combinations and configurations, other combinations and configurations, including more, less or only a single element, are also within the scope of the invention.

What is claimed is:

1. A motor control device for controlling a three-phase brushless motor that has a rotor and field coils, comprising:
   a driving circuit that includes three series circuits, each having two switching elements connected in series with each other, in correspondence with respective phases of the three-phase brushless motor, wherein the series circuits are connected in parallel with one another between a power supply and a ground, and regenerative diodes are respectively connected in parallel with the corresponding switching elements; and
   a load range determining unit that determines a rotor rotation angle range, in which the three-phase brushless motor becomes a load, as a load range when a short-circuit fault occurs in one of the plurality of switching elements, wherein the load range determining unit comprises:
      a unit that, when the short-circuit switching element is a high-side switching element arranged at a side adjacent to the power supply, determines a rotor rotation angle range, in which an induced voltage of a short-circuit phase corresponding to the short-circuit switching element is smaller than an induced voltage of at least one normal phase in a state where all the switching elements other than the short-circuit switching element are turned off, as the load range;

a unit that, when the short-circuit switching element is a low-side switching element arranged at a side adjacent to the ground, determines a rotor rotation angle range. in which an induced voltage of a short-circuit phase corresponding to the short-circuit switching element is larger than an induced voltage of at least one normal phase in a state where all the switching elements other than the short-circuit switching element are turned off, as the load range, a unit that, when the short-circuit switching element is a high-side switching element arranged at a side adjacent to the power supply, determines a rotor rotation angle range, in which any one of phase currents of the normal phases is negative where the polarity of current that flows from a side adjacent to the driving circuit toward a side adjacent to the three-phase brushless motor is positive in a state where all the switching elements other than the short-circuit switching element are turned off, as the load range; and a unit that, when the short-circuit switching element is a low-side switching element arranged at a side adjacent to the ground, determines a rotor rotation angle range, in which any one of phase currents of the normal phases is positive in a state where all the switching elements other than the short-circuit switching element are turned off, as the load range, and wherein the load range determining unit determines a rotor rotation angle range, in which load current flows through a closed circuit formed of a short-circuit switching element and any one of the regenerative diodes connected in parallel with respective normal switching elements when the rotor is rotated in a state where all the switching elements other than the short-circuit switching element are turned off, as the load range.

2. The motor control device according to claim 1, wherein the load range determining unit determines the load range on the basis of information that indicates a location of the short-circuit switching element and information prepared in advance for determining a load range from a location of the short-circuit switching element.

3. The motor control device according to claim 1, further comprising a load current suppressing unit that, when the rotor rotation angle falls within the load range that is determined by the load range determining unit, turns off the regenerative diode in the closed circuit through which load current flows.

4. The motor control device according to claim 3, wherein the load current suppressing unit includes a unit that, when the rotor rotation angle falls within the load range that is determined by the load range determining unit, drives a switching element connected in series with the regenerative diode in the closed circuit through which load current flows in a pulse width modulation manner at a carrier frequency higher than that during normal driving.

5. The motor control device according to claim 1, wherein the load range determining unit includes a short-circuit fault determining unit that acquires phase voltages of the three series circuits and that, when any one of the phase voltages is lower than or equal to a predetermined first voltage, determines a low-side switching element of any one of the three phases, arranged at a side adjacent to the ground, as the short-circuit switching element.

6. The motor control device according to claim 1, wherein the load range determining unit includes a short-circuit fault determining unit that acquires phase voltages of the three series circuits and that, when any one of the phase voltages is higher than or equal to a predetermined second voltage, a high-side switching element of any one of the three phases, arranged at a side adjacent to the power supply, as the short-circuit switching element.

7. A motor control device for controlling a three-phase brushless motor that has a rotor and field coils, comprising:

a driving circuit that includes three series circuits, each having two switching elements connected in series with each other, in correspondence with respective phases of the three-phase brushless motor, wherein the series circuits are connected in parallel with one another between a power supply and a ground, and regenerative diodes are respectively connected in parallel with the corresponding switching elements; and load range determining means that determines a rotor rotation angle range, in which the three-phase brushless motor becomes a load, as a load range when a short-circuit fault occurs in one of the plurality of switching elements, wherein the load range determining means comprises:

means that, when the short-circuit switching element is a high-side switching element arranged at a side adjacent to the power supply, determines a rotor rotation angle range, in which an induced voltage of a short-circuit phase corresponding to the short-circuit switching element is smaller than an induced voltage of at least one normal phase in a state where all the switching elements other than the short-circuit switching element are turned off, as the load range, means that, when the short-circuit switching element is a low-side switching element arranged at a side adjacent to the ground, determines a rotor rotation angle range, in which an induced voltage of a short-circuit phase corresponding to the short-circuit switching element is larger than an induced voltage of at least one normal phase in a state where all the switching elements other than the short-circuit switching element are turned off, as the load range, means that, when the short-circuit switching element is a high-side switching element arranged at a side adjacent to the power supply, determines a rotor rotation angle range, in which any one of phase currents of the normal phases is negative where the polarity of current that flows from a side adjacent to the driving circuit toward a side adjacent to the three-phase brushless motor is positive in a state where all the switching elements other than the short-circuit switching element are turned off, as the load range; and means that, when the short-circuit switching element is a low-side switching element arranged at a side adjacent to the ground, determines a rotor rotation angle range, in which any one of phase currents of the normal phases is positive in a state where all the switching elements other than the short-circuit switching element are turned off, as the load range, and wherein the load range determining means determines a rotor rotation angle range, in which load current flows through a closed circuit formed of a short-circuit switching element and any one of the regenerative diodes connected in parallel with respective normal switching elements when the rotor is rotated in a state where all the switching elements other than the short-circuit switching element are turned off, as the load range.

* * * * *